United States Patent [19]
Bruckner et al.

[11] 3,800,268
[45] Mar. 26, 1974

[54] ELECTRICAL CONNECTOR FOR TRANSISTOR OUTLINE SEMICONDUCTOR DEVICE

[75] Inventors: Richard Bruckner, Chester; John L. Tansky, Collingdale, both of Pa.

[73] Assignee: Bunker Ramo Corporation, Oak Brook, Ill.

[22] Filed: May 31, 1972

[21] Appl. No.: 258,453

[52] U.S. Cl. 339/66 M, 339/185 R
[51] Int. Cl. H01r 13/62
[58] Field of Search 339/65, 66, 185

[56] References Cited

UNITED STATES PATENTS

| | | | |
|---|---|---|---|
| 2,885,649 | 5/1959 | Long | 339/66 R |
| 2,955,352 | 10/1960 | Wintriss | 339/66 T |
| 3,107,963 | 10/1963 | Hansen | 339/65 |
| 3,184,536 | 5/1965 | Vincent | 339/65 |

FOREIGN PATENTS OR APPLICATIONS

| | | | |
|---|---|---|---|
| 619,560 | 3/1949 | Great Britain | 339/66 R |

*Primary Examiner*—Joseph H. McGlynn
*Attorney, Agent, or Firm*—F. M. Arbuckle; W. Lohff

[57] ABSTRACT

An electrical connector for semiconductor devices such as transistor outline devices with rearwardly extending leads is provided to accommodate devices having a variety of lead arrangements, wherein the connector includes an insulating base with a front face, a plurality of openings spaced apart along a common line and extending rearwardly through the base, one other opening laterally displaced from the common line with a deflection ramp extending between the common line and the other opening to accommodate either an in-line or staggered lead, the in-line openings including slots elongated parallel to the common line with the displaced opening including a slot elongated in a direction perpendicular thereto, and a plurality of contacts rearwardly mounted in the openings with lead-engagement portions covering the rear perimeter of the elongated slots and being laterally deflectable by insertion of the leads, the contacts including stop portions rearwardly disposed from the engagement portions to block passage of the leads rearwardly beyond the base.

4 Claims, 8 Drawing Figures

ELECTRICAL CONNECTOR FOR TRANSISTOR OUTLINE SEMICONDUCTOR DEVICE

BACKGROUND OF THE INVENTION

In interconnecting semiconductor devices such as transistor outline semiconductor devices to printed circuit baords, electrical connectors are often utilized to provide contacting surfaces shaped to better accommodate both the thin, elongated leads of the device with the contrasting flat conductive strip on the printed circuit board. In addition, since replacement of the device may be necessary, contact tails of the connectors can be soldered to the conductive strips while the connector provides releasable engagement with leads of the device.

As used herein, the term "transistor outline" describes a semiconductor device having the conventional outline of a transistor wherein the device includes a plurality of leads extending in a parallel arrangement rearwardly from a support or body which houses a semiconductor. Commercially, these devices have been produced with a variety of lead patterns requiring a like variety of connectors. In one form, the leads are spaced apart on the support along a common line to form an "in-line" pattern and extend rearwardly from the support in a parallel arrangement. In another form, some of the leads are in-line while one or more other leads are laterally offset from the common line.

One of the problems with many of these connectors utilized with transistor outline semiconductor devices is that the connectors can accommodate only one form of the device. Although openings in the connectors may accept leads with slight misalignment, if the device has a lead displaced a significant distance from that of the initial device used with the connector, the thin, flexible, elongated lead can be bent away from any opening or into an incorrect opening. Under these circumstances, it is often necessary to maintain an inventory of devices having a variety of lead arrangements determined by the particular arrangement of openings in the connectors, even though the inventory could be minimized by utilizing substitution devices with different lead patterns.

SUMMARY

The invention relates to electrical connectors for semiconductor devices having a plurality of elongated leads rearwardly extending from a support which houses at least one semiconductor device, and more particularly to connectors capable of accepting devices with both in-line and staggered lead arrangements with at least one of the leads being readily deflectable by a sloped surface on the connector.

Briefly, the connector comprises an insulating base provided with a front face for receiving in spaced relationship the support of the device, a plurality of openings rearwardly extending into the base, and a plurality of metallic contacts disposed in the openings for engagement with the leads of the device, with at least one of the openings being elongated in a direction perpendicular to the rearward extension of the opening or its longitudinal axis. More particularly, the elongation has a length which is at least twice its width and is spaced in the base to accommodate a variety of lead arrangements. A plurality of elongated openings may be provided with at least one opening being elongated in a direction perpendicular to that of at least a portion of the other openings.

In the preferred embodiment, a major portion of the openings are arranged along a common line with at least one other opening being laterally displaced from the line and having an elongated slot perpendicular thereto. This arrangement is capable of accepting leads in a variety of positions with this feature being further improved by a deflection means in the form of a deflection ramp extending from the common line to the opening for the deflection of an in-line lead into the opening.

Advantageously, the in-line openings are also elongated with the elongation being in a direction generally parallel to the common line. The openings are further provided with funnel-like lead entrances to reorient leads which are misaligned or slightly bent.

In addition, contacts are rearwardly disposed in enlarged rear cavities in the openings and include lead-engagement portions which cover and advantageously extend beyond the smaller perimeter of the elongated slot. Advantageously, these contacts include deflectable engagement portions such as deflection beams with the deflection being perpendicular to the length of the elongated slot and to the longitudinal axis of the opening. This arrangement is particularly advantageous with the offset opening since the opening and contact can accept a lead inserted anywhere along the length of the slot or a lead deflected by the deflection ramp at an angle into the slot. Since deflection of the engagement portion of the contact occurs perpendicularly to the elongated direction of both the deflection ramp and slot, deflection is accomplished anywhere along the length of the slot with substantially the same degree of force.

As a further feature of the contacts, a stop portion is provided rearwardly on the contact and below the smaller perimeter of the slot to block passage of the lead beyond the desired depth in the base. Advantageously, the stop position is formed as an enlarged lateral flange which adjoins the rear face of the insulating base and blocks passage of lead beyond the base to the circuit on the underlying printed circuit base. The stop portion also advantageously supports an offset tail portion which permits increased separation of the tail portions beyond that of the contacts.

Of the several advantages associated with the invention, one is that the connector can accommodate semiconductor devices having a variety of lead arrangements. Another advantage is that the connector can accommodate forms of the devices wherein some lead positions are varied along a common line and others in a lateral direction with respect thereto. A further advantage is that contacts are provided which limit the distance that the leads can be inserted and block their passage beyond the base to avoid accidental connection with the underlying circuit on the printed circuit board.

DETAILED DESCRIPTION

Figures 1A, 1B, 2, 3, 4, 5, 6, 7:
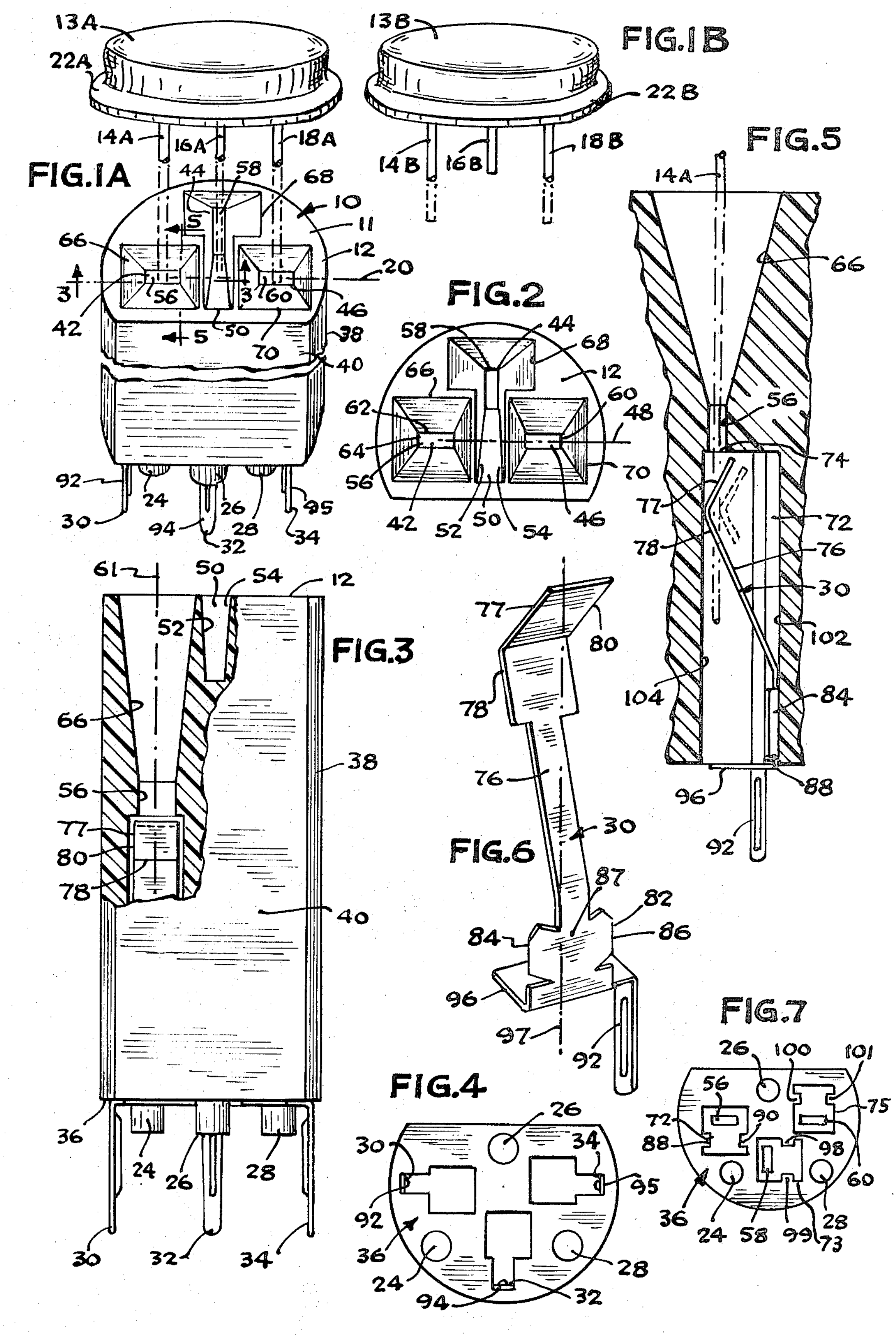
FIG. 1A is a perspective view of a connector and associated semiconductor device in accordance with one embodiment of the invention.
FIG. 1B is a perspective view of a semiconductor device with a different arrangement of leads from that illustrated in FIG. 1A.
FIG. 2 is a top view of the connector of FIG. 1A.
FIG. 3 is a front view partially in cross section of the connector of FIG. 1A taken along line 3—3.
FIG. 4 is a bottom view of the connector of FIG. 1A.
FIG. 5 is a side view in cross section of the connector of FIG. 1A taken along line 5—5.
FIG. 6 is a perspective view of the contact of FIG. 5.
FIG. 7 is a bottom view of the connector of FIG. 1A prior to the mounting of the contacts.

Referring now in detail to FIGS. 1-7, reference 10 represents an electrical connector provided with an insulating base 11 with front face 12 and adapted for use with known semiconductor devices having a plurality of elongated leads of conductive metal projecting from a support with a portion of all of the leads being arranged along a common line. As illustrated in FIG. 1A, the semiconductor device is represented by transistor outline 13A in which leads 14A, 16A, and 18A are arranged in-line or along a common line 20, while transistor outline 13B in FIG. 1B includes leads 14B and 18B in-line with lead 16B being laterally offset or staggered with respect to common line 20. These leads provide an external electrical connection to the semiconductor elements (not shown) housed in supports 22A and 22B and by way of illustration can be in the order of about 0.500 inches long and about 0.020 inches in diameter.

As illustrated, connector 10 is adapted to interconnect the above semiconductor devices to a printed circuit board (not shown) and includes insulating standoffs 24, 26, and 28 and contacts 30, 32, and 34 rearwardly extending from rear face 36 of base 11 for respective separation of base 11 from the board and electrical connection with a conductive circuit element.

In addition to front and rear faces 12 and 36, base 11 includes rounded sidewall 38 and flat sidewall 40 forming a D-shape for use with mechanical handling equipment. Base 11 is of molded construction and composed of a suitable insulating material such as polycarbonate.

Provided on front face 12 are a plurality of openings 42, 44 and 46 which extend rearwardly in base 11 and are spaced to receive leads 14, 16, and 18. As illustrated, openings 42 and 46 are arranged along a common line 48 while opening 44 is laterally displaced from line 48 a distance sufficient to receive staggered lead 16B of FIG. 1B. In order to accommodate in-line lead 16A of FIG. 1A, a deflection ramp 50 extends between line 48 and opening 44 and is tapered rearwardly toward opening 44. When lead 16A is inserted in base 11, deflection ramp 50 causes the thin, flexible lead to deflect a sufficient extent to reach opening 44 and contact 32. As illustrated, ramp 50 also includes side guide walls 52 and 54 which serve to restrict the deflection to a lateral direction and avoid entry by lead 16A into openings 42 or 46.

A further feature of openings 42, 44, and 46 is that they are formed with slots 56, 58, and 60 elongated in two different directions with all being generally perpendicular to the longitudinal axis 61 of the opening 42. Slots 56 and 60 are elongated in the direction generally parallel to common line 48 while slot 58 is elongated in a direction generally perpendicular to line 48, thereby providing electrical accessibility for semiconductor devices in which the leads are separated by a relatively wide range of distances. In the preferred embodiment, representative slot 56 has a length 62 of a dimension at least twice that of width 64 with particular values (not for limitation) being in the order of 0.060 inches × 0.023 inches with slots 56 and 60 being on 0.160 centers and the center of slot 58 being separated from common line 48 by about 0.080 inches. Deflection ramp 50 is approximately 0.120 inches long and is tapered to slot 58 set at a depth of 0.275 inches. In this arrangement of deflection ramp 50 and slot 58, leads 16 can either be in-line or offset as much as 0.110 inches.

As illustrated in FIGS. 1–3, openings 42, 44, and 46 further include frontwardly disposed funnel-like lead entrances 66, 68, and 70 which converge inwardly toward respective slots 56, 58, and 60 for guide purposes.

A plurality of electrical contacts 30, 32, and 34 are disposed in openings 42, 44, and 46 for engagement with leads 14, 16, and 18. As represented by contact 30 in opening 42 in FIG. 5, each opening includes a rearwardly disposed enlarged cavity 72 contiguous with frontwardly disposed slot 56 of restricted perimeter 74 with their center lines laterally offset. Contact 30 is shaped to include a lead-engagement portion represented by cantilever arm 76 with surface 77 which extends across perimeter 74 to insure electrical engagement with inserted lead 14. As a further advantage, cantilever arm 76 includes preloaded bow 78 with free-ended frontwardly disposed arm 80 being tapered so that the insertion of lead 14 causes bow 78 to be laterally deflected and provide a wiping action against lead 14.

As illustrated in FIGS. 5–6, contact 30 also includes mounting portion 82 with opposite barbed flanges 84 and 86 extending from central web 87 to provide an interference fit against ridges 88 and 90 (FIGS. 6–7) in cavity 72. Tail portion 92 is rearwardly disposed on contact 30 and is laterally offset to provide an increased separation of the tail portions 92, 93, and 95 (FIG. 4). Intermediately disposed between cantilever arm 76 and the tail portion 92 is stop portion 96 shaped as a wide flange in position generally perpendicular to the longitudinal axis 61 of opening 42 to prevent lead 14 from passing beyond rear face 36 and accidentally causing electrical connection with a conductive element on the underlying printed circuit board.

In FIG. 7, the rear face 36 of base 11 is illustrated prior to the mounting of contacts 30, 32, and 34. As illustrated, rear cavities 72, 73, and 75 are provided with a pair of ridges 88 and 90, 98 and 99, and 100 and 101 which serve as mounting surfaces for flanges 84 and 86 of contact 30 and corresponding mounting flanges of contacts 32 and 34. The mounting of representative contact 30 is carried out by inserting the contact rearwardly into rear cavity 72 with flanges 84 and 86 being positioned in an interference fit along ridges 88 and 90 and opposite the slot 56 in order to place mounting portion 82 in close relationship with cavity wall 102. During frontward movement of contact 30 in cavity 72, cantilever arm 76 is placed in a preloaded condition and slides against cavity wall 104 which is opposite the wall 102, thereby resulting in an accurate positioning of contact 30 in cavity 72. As illustrated in FIG. 5, contact 30 in its mounted position includes stop portion 96 extending across the major portion of opening 42 to rearwardly block passage of semiconductor lead 14 beyond rear face 36. Tail portion 92 is offset from the longitudinal axis 97 of contact 30 and extends rearwardly beyond rear face 36 for connection by soldering to an external conductor. As an example of contact 30 and not for limitation purposes, contact 30 is of a one-piece, sheet metal construction and composed of hardened brass. Cantilever arm is approximately 0.300 inches long with free-ended arm 80 forming the frontward portion of bow 78 being about 0.070 inches long and greater than 0.060 inches wide to cover the respective dimensions 0.023 inches × 0.060 inches of slot 56.

The foregoing description of the present invention is only illustrative of an exemplary form which the invention may take. Still other modifications and variations will suggest themselves to persons skilled in the art. It is intended, therefore, that the foregoing detailed description be considered as exemplary only and that the scope of the invention be ascertained from the following claims.

we claim:

1. An electrical connector for a semiconductor device having a plurality of elongated metallic leads extending rearwardly from a support, at least a portion of said leads extending rearwardly from a support, at least a portion of said leads being in-line, said connector comprising:

an insulating base including a front face for receiving in spaced relationship the semiconductor device, at least two openings extending rearwardly in said base and spaced apart along a common line, each opening being elongated in a direction generally parallel to said common line and spaced to receive one of said leads, at least one other opening extending rearwardly in said base and elongated in a direction generally perpendicular to said common line, said opening disposed between said two openings but laterally displaced from said common line, each of said two openings and said other opening including a frontwardly disposed funnel-like lead entrance, the funnels for said two openings being spaced apart along said common line, a plurality of metallic contacts disposed in said openings, the contact in said one other opening being rearwardly spaced apart from said front face, and a deflection ramp with side guide walls disposed at said common line between the lead entrances for said two openings and extending therefrom to said one other opening, said ramp being tapered rearwardly to said other opening to deflect an in-line lead of said semiconductor device into electrical engagement with the contact in said one other opening.

2. The connector of claim 1 wherein the funnel-like lead entrance for said other opening is spaced apart from said common line.

3. The connector of claim 1 wherein at least one of said contacts includes a frontwardly disposed lead-engagement portion, a rearwardly disposed tail portion for connection to an external conductor, and an intermediately disposed stop portion extending laterally across at least a portion of said opening for limiting the depth of insertion of said lead.

4. The connector of claim 3 wherein said one contact is disposed in one of said openings, said one opening including a rearwardly disposed cavity and frontwardly disposed therefrom a slot of restricted perimeter, said one contact disposed in said first cavity and including a lead-engagement portion laterally deflectable by said lead and having a surface extending over said restricted perimeter.

* * * * *